United States Patent [19]

Gaur et al.

[11] 4,435,898
[45] Mar. 13, 1984

[54] METHOD FOR MAKING A BASE ETCHED TRANSISTOR INTEGRATED CIRCUIT

[75] Inventors: Santosh P. Gaur; John S. Lechaton, both of Wappingers Falls; Gurumakonda R. Srinivasan, Poughkeepsie, all of N.Y.

[73] Assignee: International Business Machines Corporation, Armonk, N.Y.

[21] Appl. No.: 360,731

[22] Filed: Mar. 22, 1982

[51] Int. Cl.³ .................. H01L 21/302; H01L 21/22
[52] U.S. Cl. .................. 29/577 C; 29/576 E; 29/576 W; 29/578; 29/580; 148/175; 148/187; 156/643; 156/653; 156/657; 156/626; 357/20; 357/34; 357/50; 357/55
[58] Field of Search ........... 29/576 E, 576 W, 577 C, 29/578, 580; 148/175, 187; 156/643, 653, 657, 662, 626, 627; 357/20, 34, 40, 48–50, 55

[56] References Cited

U.S. PATENT DOCUMENTS

| | | | |
|---|---|---|---|
| 3,312,881 | 4/1967 | Yu | 317/235 |
| 3,489,622 | 1/1970 | Barson et al. | 148/187 |
| 3,551,220 | 12/1970 | Meer et al. | 148/175 |
| 3,669,760 | 6/1972 | Rein et al. | 148/1.5 |
| 3,677,837 | 7/1972 | Ashar | 148/175 |
| 3,717,515 | 2/1973 | Ashar et al. | 148/175 |
| 3,926,695 | 12/1975 | U | 148/187 |
| 3,966,577 | 6/1976 | Hochberg | 204/192 |
| 4,066,473 | 1/1978 | O'Brien | 148/175 X |
| 4,069,096 | 1/1978 | Reinberg et al. | 156/643 |
| 4,104,086 | 8/1978 | Bondur et al. | 148/1.5 |
| 4,135,954 | 1/1979 | Chang et al. | 156/643 X |
| 4,139,442 | 2/1979 | Bondur et al. | 204/192 |
| 4,177,094 | 12/1979 | Kroon | 148/175 |
| 4,289,550 | 9/1981 | Feist | 148/175 |
| 4,367,044 | 1/1983 | Booth et al. | 156/626 X |

OTHER PUBLICATIONS

IBM Technical Disclosure Bulletin, vol. 20, No. 4 Sep. 1977 "High-Performance Transistor Structure" by K. Malin, pp. 1495–1496.

Levi, R., "Reactive Ion Etch Technique . . . Reducing Series Resistance . . . " I.B.M. Tech. Discl. Bull., vol. 20, No. 8, Jan. 1978, pp. 3127–3128.

Primary Examiner—W. G. Saba
Attorney, Agent, or Firm—George O. Saile

[57] ABSTRACT

A process is described which permits the fabrication of very narrow base width bipolar transistors. The ability to selectively vary the transistor characteristics provides a degree of freedom for design of integrated circuits. The bipolar transistor is processed up to the point of emitter formation using conventional techniques. But, prior to the emitter formation, the base area which is to be the emitter is dry etched using reactive ion etching. The existing silicon nitride/silicon dioxide layers with the emitter opening therein are used as the etching mask for this reactive ion etching procedure. Once the etching is completed to the desired depth, the normal processing is resumed to form the emitter and rest of the metallization. Since the intrinsic base under the emitter is etched. and the normal emitter is formed afterwards, the etching reduces the base width by an amount approximately equal to the etched depth. The transistor characteristics depend strongly upon the base width so the etching is controlled to very tight dimensions.

12 Claims, 6 Drawing Figures

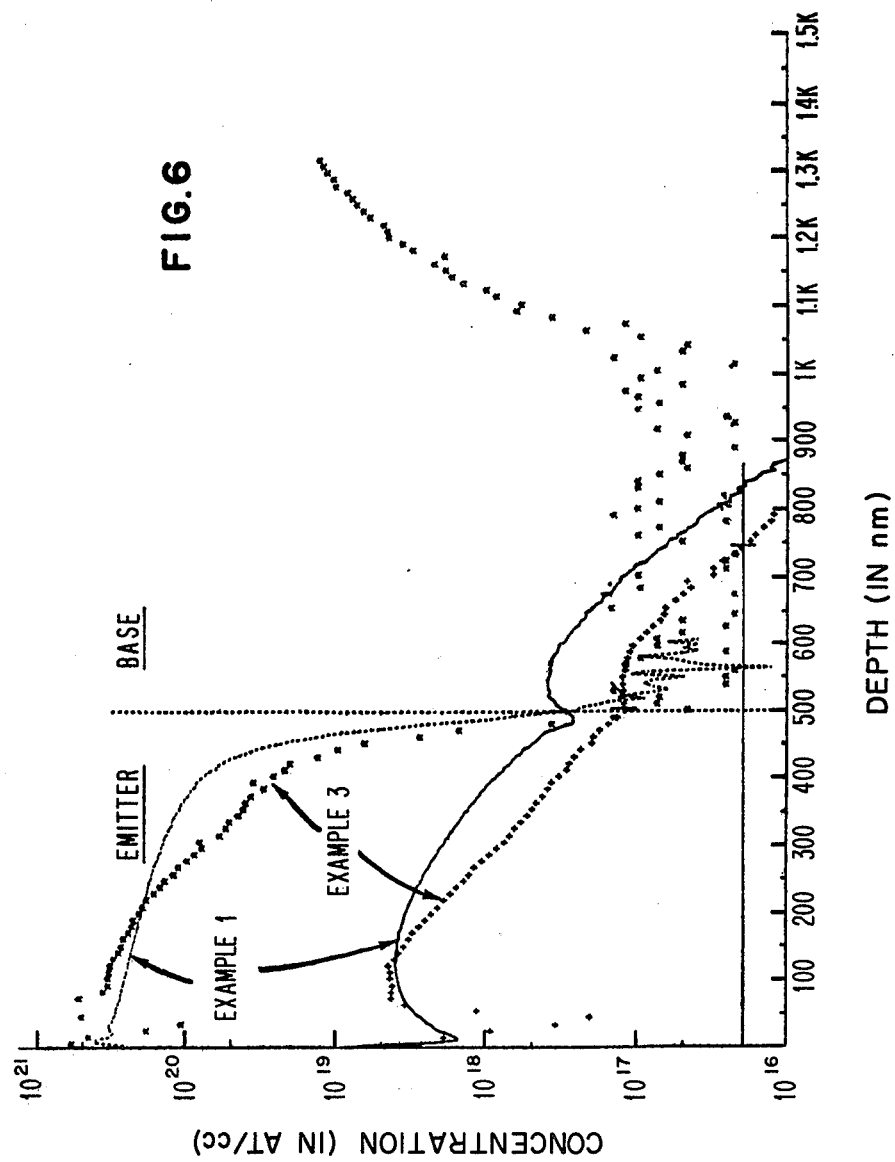

METHOD FOR MAKING A BASE ETCHED TRANSISTOR INTEGRATED CIRCUIT

DESCRIPTION

Technical Field

The invention relates to methods and resulting structures for the fabrication of very narrow base width bipolar transistors on an integrated circuit chip.

Cross-reference to Related Patent Applications

Patent application pending Ser. No. 360,730, filed like date on Mar. 22, 1983, entitled "Method and Resulting Structure for Selective Multiple Base Width Transistor Structures" by J. A. Dorler et al.

Background Art

Semiconductor integrated circuits have substantially increased in density in the past decade. However, there is an increasing demand for even greater complexities, higher switching speeds and smaller devices for new applications, such as microprocessers or minicomputers. It is known that thin base regions are very desirable for high performance bipolar transistor devices which have very high operating speeds and amplification characteristics. There have been methods proposed for producing such very narrow base regions over the years. Of the methods that have been used, diffusion, and ion implantation with or without the combined use of etching have been used to produce narrow base region devices.

One line of patents which have worked toward the narrow base structure involves what is called the pedestal transistor. The patents required accurately controlling junction depths, epitaxial layer thicknesses, surface uniformity, and quality to form these devices of small geometry. Examples of this technology is the H. N. Yu U.S. Pat. No. 3,312,881; F. Barson et al. U.S. Pat. No. 3,489,622; K. G. Ashar U.S. Pat. No. 3,677,837 and K. G. Ashar et al. U.S. Pat. No. 3,717,515. Each of these patents attempt to control the narrow base width through various diffusion techniques and in no way utilize the etching technique of the present invention.

Another series of patents and publications utilize the etching technique for removal of portions of the base region followed by the emitter diffusion. The examples of this technology is the W. Meer et al. U.S. Pat. No. 3,551,220; Hans-Martin Rein et al. U.S. Pat. No. 3,669,760; Aung San U U.S. Pat. No. 3,926,695 and K. Malin IBM Technical Disclosure Bulletin, Vol. 20, No. 4, September 1977, pages 1495–1496. While these publications do describe etching, they all describe a chemical etching technique which produces the undercutting of the etching mask within the base region. This chemical etching process cannot be well controlled and the etching solution introduces unwanted impurities into the small dimensioned geometries that workers in the field desire in the very large scale integration technology.

Plasma or reactive ion etching is a technique which has been developed for etching metals, semiconductor materials and dielectrics in the manufacture of integrated circuit devices. In particular, the method of reactive ion etching is capable of doing anisotropic etching wherein very high aspect ratios is obtainable. High aspect ratio means, in this context, the ratio of vertical etching is much greater than the horizontal etching. The process involves the use of a plasma or ionized gas containing a variety of highly reactive material, such as ions, free electrons, and free radicals. The plasma used in etching may be maintained at relatively low temperatures and pressures in the range of less than about 20 Torr. The process has been used to etch depressions in silicon semiconductor bodies for a variety of reasons, such as shown in the A. K. Hochberg U.S. Pat. No. 3,966,577 issued June 29, 1976; J. A. Bondur et al. U.S. Pat. No. 4,104,086 and J. A. Bondur et al. U.S. Pat. No. 4,139,442. However, there is no suggestion or understanding of the need in any of these patents of the use of the reactive ion etching technique for making very narrow base bipolar transistor structures.

Summary of the Present Invention

In accordance with the present invention a process is described which permits the fabrication of very narrow base width bipolar transistors. The ability to selectively vary the transistor characteristics provides a degree of freedom for design of integrated circuits. The bipolar transistor is processed up to the point of emitter formation using conventional techniques. But, prior to the emitter formation, the base area which is to be the emitter is dry etched using reactive ion etching. The existing silicon nitride/silicon dioxide layers with the emitter opening therein are used as the etching mask for this reactive ion etching procedure. Once the etching is completed to the desired depth, the normal processing is resumed to form the emitter and rest of the metallization. Since the intrinsic base under the emitter is etched, and the normal emitter is formed afterwards, the etching reduces the base width by an amount approximately equal to the etched depth. The transistor characteristics depend strongly upon the base width under most circumstances. It is therefore necessary to control the etching to very tight dimensions. In prior techniques the problem involved was the reproducibility of etching depths. The present invention is based upon the ability to very accurately control the etching depth. This is done by using the particular reactive ion etching process in conjunction with an in situ polycrystalline silicon thickness monitor together with a laser interferometer.

Specifically, the method for forming the very high performance bipolar transistor in an integrated circuit involves first providing a monocrystalline silicon substrate having a pattern of regions of the monocrystalline silicon isolated from one another by a dielectric isolation pattern on one major surface of the substrate. A subcollector region is provided within the monocrystalline silicon and spaced from that major surface. A base region in at least certain of the regions of silicon is formed down to the subcollector region wherein the base region has a concentration of than about $1 \times 10^{18}$ atoms/cc at the surface and the collector-base junction depth is preferably between about 800 to 850 nanometers in depth. A depression is formed in the base region by a precise reactive ion etching process to a depth of about 70 to 100 nanometers. The depression is formed in that portion of base region wherein an emitter region is planned to be formed. An emitter region is then formed in this etched portion of the base region by ion implantation or diffusion and a heating cycle wherein a narrow intrinsic base region is completed. The appropriate contacts are then made to each of the elements of the bipolar transistor.

Brief Description of the Drawings

The drawings show the following:

FIG. 6 is an actual impurity profile comparing a standard bipolar device with the base etched transistor structure as described in the present invention.

Disclosure of the Invention

Figure 1:
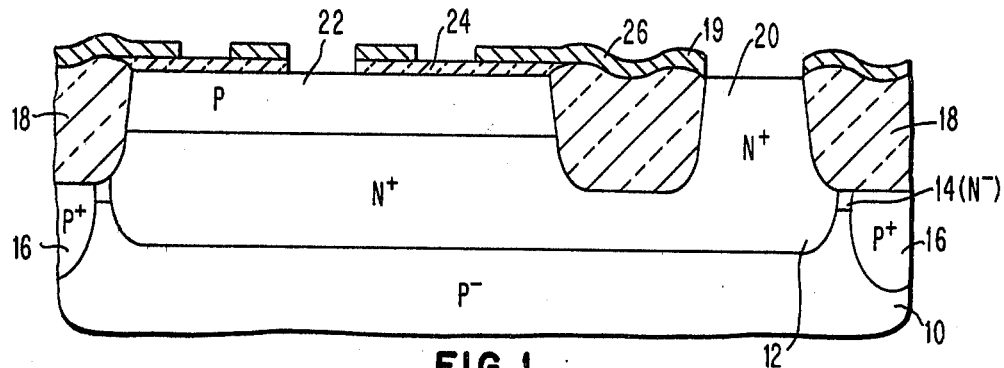
FIGS. 1 through 4 are schematic, greatly enlarged vertical illustrations for the method of one embodiment for making a very narrow base, high performance bipolar transistor.

Referring now more particularly to FIG. 1 there is illustrated an embodiment for forming NPN bipolar transistors. The FIG. 1 illustrates one small, greatly enlarged portion of the silicon body which will be used to form a very dense, high performance bipolar integrated circuit. A P— substrate of monocrystalline silicon 10 has a N+ subcollector region 12 therein. An epitaxial N— layer 14 is then grown on top of the substrate 10. These processes are standard processes in the formation of, for example, NPN bipolar transistors. The substrate is typically a <100> crystallographic orientation silicon wafer having a resistance of about 10 to 20 ohm/cm. Subcollector diffusion is typically formed using arsenic having a surface concentration of about $1 \times 10^{20}$ atoms/cm$^3$. The epitaxial growth process to form layer 14 may be by conventional techniques, such as the use of silicon tetrachloride/hydrogen or silane/hydrogen mixtures at temperatures of between about 1000° C. to 1200° C. During the epitaxial growth the dopant in the N+ layer moves into the epitaxial layer to fully form the subcollector region 12 as illustrated in FIG. 1. The thickness of the epitaxial layer for highly dense integrated circuits is of the order of 3 micrometers or less. P+ regions 16 can also be formed in the substrate 10 in the designated areas under the recessed silicon dioxide isolating regions 18 which are to be formed. These P+ regions prevent surface inversion and current leakage. A mask, such as a thermally grown silicon dioxide layer (not shown) is formed on the surface of the epitaxial layer 14 and by suitable lithography and etching techniques mask openings are formed therein.

The next series of steps in this embodiment involve the formation of isolation regions of monocrystalline silicon from other regions of monocrystalline silicon. The isolation may be back-biased PN junctions, partial dielectric isolation or complete dielectric isolation. The dielectric materials used may be silicon dioxide, glass, etc. The preferred isolation for highly dense integrated circuits is dielectric isolation. FIG. 1 shows partial dielectric isolation with dielectric regions 18 together with the P+ region 16 isolating monocyrstalline silicon regions of the silicon body from one another and region 19 which isolates the base-emitter region from the collector reach-through region. There are many ways in the art to form dielectric isolation regions of this type. It is preferred to use the process described in the Magdo et al. pending Patent application Ser. No. 150,609 filed June 7, 1971 or Peltzer U.S. Pat. No. 3,648,125. Alternately, the process described in the J. A. Bondur et al. U.S. Pat. No. 4,104,086 can be used. In that patent application and patents the processes for forming partial dielectric isolation for the regions 18 and 19 are described in detail.

The N+ collector reach-through region 20 to subcollector region 12 is formed using standard lithography, etching and diffusion or ion implantation techniques. The region 20 is typically formed with a phosphorus or arsenic dopant.

The P+ base region 22 is formed at this time using silicon dioxide masking with standard lithography, etching and diffusion or ion implantation techniques. It is preferred that the base region butt dielectric isolations 18 and 19, as shown in FIG. 1. The masking lithography layers are then removed. A first insulating layer of silicon dioxide which is preferably thermally grown is formed over the exposed silicon regions. A chemical vapor deposited silicon nitride region 26 is formed over the entire surface of the silicon body as shown in FIG. 1. This insulating combination layer may alternatively be one or a combination of known insulating materials, such as silicon dioxide, silicon nitride, aluminum oxide, or the like, in addition to the thermally grown silicon dioxide. The silicon dioxide layer 24 may be thermally grown in an oxygen or oxygen-water vapor ambient at a temperature of about 925° C. A second method for growing silicon dioxide involves the use of chemical vapor deposition process wherein silane and oxygen are used in the ambient at about 450° C. The silicon nitride layer is formed by chemical vapor deposition usually under the following conditions: Silane, ammonia and nitrogen carrier gas at a temperature of about 800° C. under atmospheric or a low pressure conditions as discussed in more detail in the V. Y. Doo U.S. Pat. No. 4,089,992.

The concentration of the base region formed is required to be more than about $1 \times 10^{18}$ atoms/cc and preferably $5 \times 10^{18}$ atoms/cc at the surface. This base region with this conductivity may be formed using either diffusion or ion implantation. The preferred diffusion process uses BBr$_3$ at 875° C. for about 45 minutes followed by a base oxidation of thickness 80±10 nanometers to drive the base into a depth of 0.5 μm. The ion implant conditions are chosen to produce a similar base profile after oxidation and drive-in. The BBr$_3$ process is preferred over ion implantation process because of reduced damage.

The collector-base junction depth is adjusted to give a final value of 800–850 nanometers for an emitter depth of 450–500 nanometers used in this example. These values are for illustration purposes only and can be suitably altered by one skilled in the art to provide base widths of the order of 100 to 400 nanometers. The collector-base junction depth could vary between, for example, about 500 to 900 nanometers. The exact specification of the junction depths is dictated by the required circuit performance. However, if the emitter is thinner than about 200 nanometers, the current gain is reduced due to heavy doping effects in the emitter. On the other hand, if the emitter is too deep, such as greater than about 500 nanometers, the device speed is reduced due to increased charge storage in the emitter.

The next series of steps involves the critical reactive ion etching process for forming the depression in the base region which allows for the controlled, reproducible and narrow base width. Using conventional lithography and etching techniques the contact openings for the base and the emitter opening and collector contact opening are made in the silicon nitride layer 26. Through further lithography and etching techniques the emitter and collector reach-through regions are opened to the monocrystalline silicon through the silicon dioxide layer 24 resulting in the FIG. 1 structure. The FIG. 1 structure is now placed in a suitable reactive ion or plasma etching environment for preferential etching of monocrystalline silicon in regions not masked by the silicon nitride and silicon dioxide. Any of the available plasma or reactive ion etching apparatus may be utilized, however, it is preferred to use a parallel plate reactive ion etcher, such as is described in J. Lechaton, J. L. Mauer Proc. of the Symposium on Plasma Etching & Deposition, Electrochem Soc. Vol. 81-1, page 75-85, 1981.

Figure 2:
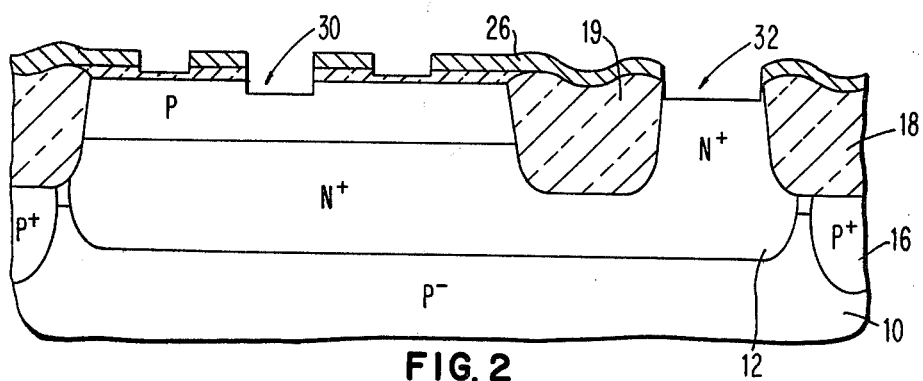

The chamber of the etching apparatus is pumped down to a vacuum equal to or less than $5 \times 10^{-6}$ Torr. The reactive etching chamber is then back-filled with a gas mixture preferably of argon and chlorine with the chlorine being 3% to 7% of the argon, chlorine gas mixture. The resulting gas pressure is about 10 millitorr. Other gases such as $CF_4$, and $SF_6/Cl_2/He$ can be used in this process. The plasma is formed and the etching of silicon commences through the emitter mask opening and the collector reach-through mask opening until the desired depth of the depression is reached. A silicon dioxide covered silicon wafer having a polycrystalline film on the silicon dioxide of the order of 300 nanometers of polycrystalline silicon is placed within the chamber of the reactive ion etcher. A laser interferometer is positioned directly above this polycrystalline silicon film wafer. During the etching of the silicon wafers a constant readout is made by the laser interferometer to determine precisely when the desired depth of silicon etching has been reached. A preferred laser interferometer uses a He-Ne laser. One complete fringe using the He-Ne laser measured on the recorder for polycrystalline silicon is equivalent to 80 nanometers in depth in the monocyrstalline silicon. By pre-etching the polycrystalline silicon to a maximum or minimum in the fringe, it is possible to repeatably etch exactly 80 nanometers in the silicon by etching for one fringe on the polycrystalline silicon monitor. At that point of desired etching the reactive ion etcher is turned off and etching ends. It is preferred that the etching depth range from 70 to 100 nanometers. It is undesirable to go more than 100 nanometers because of the low doping of the remaining base and the resulting low punch-through voltage. The resulting structure is shown in FIG. 2 wherein the depression 30 in the base is shown and the depression 32 in the collector reach-through is given. It should be noted that the exposed silicon dioxide in the base contact regions have been slightly etched (about 14 nanometers) during this reactive ion etching process.

Figure 3:
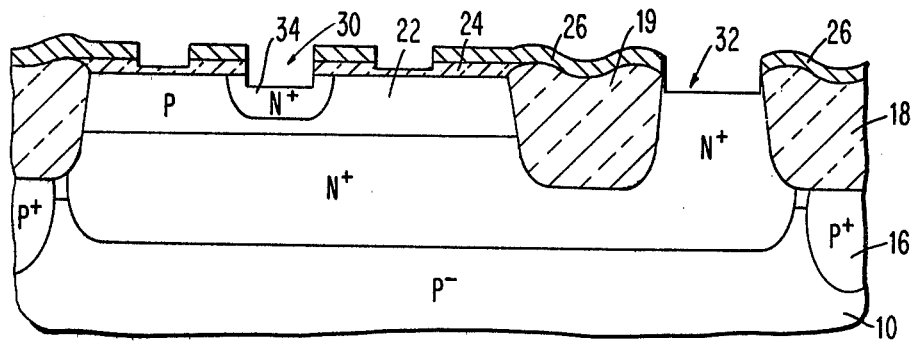

The emitter is now formed using As capsule diffusion or ion implantation. The preferred diffusion process conditions are 1000° C. for 115±25 minutes. To achieve an emitter-base junction depth of 450 to 550 nanometers and base-collector junction, after this temperature cycle, of 800–850 nanometers. These conditions may be varied to produce the desired transistor structure. This processing results in a base width of about 300 nanometers. However, base widths of 100 to 400 nanometers can readily be fabricated by this process. FIG. 3 shows the result of this emitter process.

The formation of arsenic emitter by ion implantation is an alternative to the diffusion process. An illustrative process uses an implantation energy of 50 KeV with an implantation dosage of about $9.5 \times 10^{15}$. The screen silicon dioxide thickness used is typically 225 Å. The emitter drive-in heat cycle is about 73 minutes at 1000° C. This ion implantation process can be used to form the same junction depths described in regard to the diffusion process.

Figure 4:
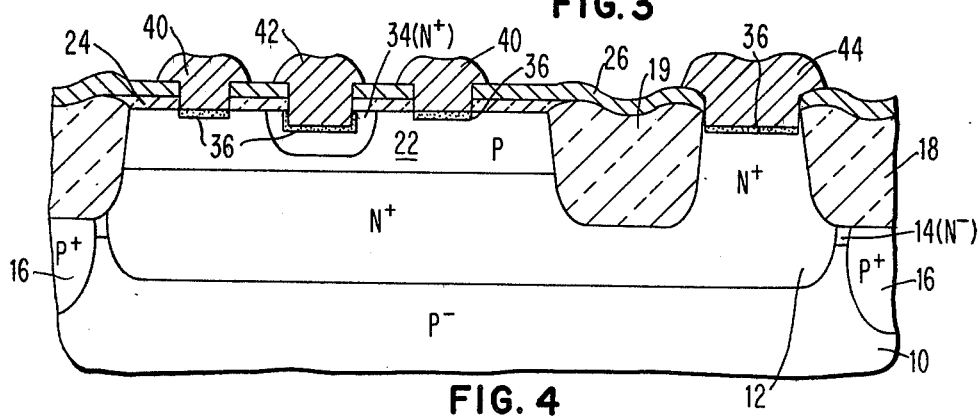

A suitable etchant is utilized to remove the remaining silicon dioxide from the base contact regions shown in FIG. 3. A wide variety of metal ohmic contacts may be utilized for this structure. However, there is shown as an example a platinum or palladium silicide ohmic contact 36 for each of the elements of the transistor. This is formed by blanket depositing palladium or platinum metal over the bare silicon as well as the silicon nitride surfaces. The structure is heated to form either palladium or platinum silicide where the metal contacts the silicon. The unreacted metal is now removed by conventional etching. A blanket metal layer of transition metal, aluminum, aluminum-copper or the like, is deposited over the palladium or platinum silicide and the silicon nitride layer. Conventional lithography and etching techniques are used to delineate the blanket metal layer to form the base contacts 40, emitter contact 42 and collector contact 44 as shown in FIG. 4.

Figure 5:
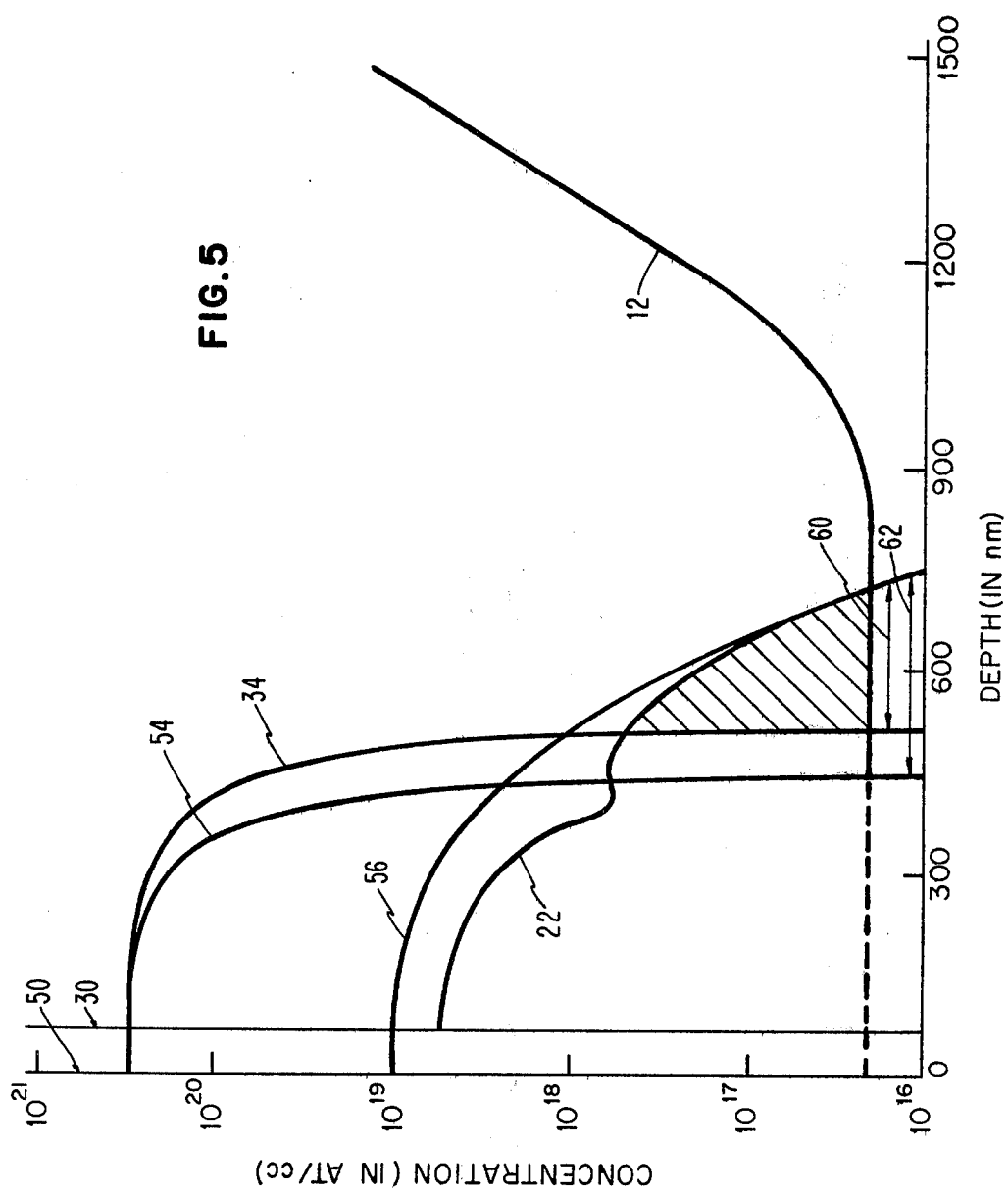
FIG. 5 schematically illustrates the impurity profile for the resulting transistor from the FIG. 1 through 4 process.

FIG. 5 is the impurity profile of the device made according to the FIG. 1 through FIG. 4 process as compared to a standard wide base transistor. The abscissa is the depth in nanometers from the surface 50 of the monocrystalline silicon. The ordinate gives the impurity concentration in atoms/cc. The base etched depression 30 is shown on the FIG. 5 diagram. The base etched transistor emitter is given as 34 while the non-etched emitter is given as 54. The base etched transistor base is given as 22 while the non-base etched emitter base is given as 56. The collector is shown as 12. The difference in base width between the base etched transistor and the non-base etched transistor is given as the base etched transistor base width 60 and the non-base etched transistor base width 62. The electrical characteristics of this base etched device is substantially improved both in gain and speed of operation characteristics.

The following examples are included merely to aid in the understanding of the invention and variations may be made by one skilled in the art without departing from the spirit and scope of the invention.

Examples 1 through 4

Four silicon wafers were processed according to the procedures described above with reference to FIG. 1. The base-collector junction depth was 820 nanometers for each of the wafers. The wafers of Example 2, 3, and 4 were etched by 40, 80, and 120 nanometers respectively, by reactive ion etching process in a chlorine/argon system with a chlorine content within the gaseous mixture of 3%. The pressure with the argon/chlorine mixture was 10 millitorr. The power was 0.16 watts/cm$^2$. The base of Example 1 was not etched and was the control wafer. The etch depth was accurately controlled in the single crystal silicon by in situ monitoring a polysilicon wafer with a He-Ne laser. The accuracy of this control is ±10 nanometers. After the intrinsic base etching, all wafers were processed for the emitter diffusion in the identical manner. The emitter is now formed using As capsule diffusion. The diffusion process conditions are 1000° C. for 115±25 minutes to achieve an emitter-base junction depth of 450 to 550 nanometers and base-collector junction, after this temperature cycle, of 800–850 nanometers.

Platinum silicide contacts were formed on the four wafers as described in the above description with regard to FIG. 4. The various electrical tests were made to compare the device characteristics of the base etched transistors of Examples 2, 3, and 4 to the control transistors which was made according to Example 1. These results are given in Table I. Table II is a comparison of the Example 3, 80 nanometer, base etched transistor with those of the control unetched transistor of Example 1.

TABLE I

| Example | Base Etch (nm) | Metallurgical Base Width (nm) | Current Gain (B) | $BV_{CEO}$ (V) | Remarks |
|---|---|---|---|---|---|
| 1 | 0 | 330 | 130 | 6.7 | Avalanche Breakdown |
| 2 | 40 | 290 | 250 | 6.0 | Avalanche Breakdown |
| 3 | 80 | 210 | 500 | 5.0 | Avalanche Breakdown |
| 4 | 120 | 90 | 1500 | 2.0 | Punch-Through |

TABLE II

| Characteristics | Example 3 | Example 1 |
|---|---|---|
| Current Gain | 500 | 130 |
| Intrinsic Base Resistance (KΩ/□) | 22 | 7 |
| Emitter Transit Time ($\tau_e$ps) | 10–12 | 38 |
| Diffusion Capacitance (pf) at 1mA | 0.8 | 1.4 |
| at 3mA | 2.6 | 4.2 |
| Junction Breakdown (V) $BV_{EBO}$ | 3.9 | 3.9 |
| $BV_{CEO}$ | 5.0 | 6.7 |
| $BV_{CBO}$ | 15.0 | 20.0 |
| TTL Circuit Delay (ns) | 1.18 | 1.32 |

Example 1 compared to the Examples 2, 3, and 4 with their several etched depths is substantially poorer in current gain (beta). It is seen that the current gain doubled approximately for every 40 nanometers of etching. It should be noted that the device does not punch-through until the current gain reached a value larger than about 500. The 80 nonometer etched device of Example 3 has been characterized in detail in terms of changes of the emitter/base diffusion capacitance $C_d$, transit time, current gain and the breakdown voltages in Table II. The Table II also shows a decrease in circuit delay due to the 80 nanometer etched base used in TTL circuitry. The effect on the the circuit delay is expected to be higher for other circuits, such as current switch emitter follow and Schottky current switch. Uniformity measurements over a number of wafers showed that the base etched transistor process produces a very tight distribution in chip delay (1 sigma equals about 2%). The combined advantage of very high current gain, low extrinsic base resistance, and low carrier transit time together with approximately the same breakdown voltage makes this structure extremely valuable.

FIG. 6 is a secondary ion mass spectroscopy, SIMS, profile for Example 3 with the base width reduced by 80 nanometers compared to the unetched control which is Example 1. It is to be noted that the base-etched transistor (BET) has a physical base width of about 250 nanometers and that because of the removal of the highly etched portion of the base, the resulting base has a lower integral base doping. This causes a narrower electrical base width than the physical base width due to the depletion, and explains the rather large decrease (3x) in the emitter transit time due to 80 nanometers base etching.

While the invention has been particularly shown and described with reference to the preferred embodiments thereof, it will be understood by those skilled in the art that the foregoing and other changes in form and details may be made without departing from the spirit and scope of the invention.

What is claimed is:

1. A method of making a high performance bipolar transistor in an integrated circuit comprising:
   providing a monocrystalline silicon substrate having a pattern of regions of said silicon isolated from one another by a dielectric isolation pattern on one major surface of said substrate;
   providing a subcollector region within said silicon and spaced from said major surface;
   forming a base region in at least certain of said regions of silicon down to said subcollector region wherein said base region has a surface concentration of more than about $1 \times 10^{18}$ atoms/cc;
   forming a surface mask opening down to the surface of the said silicon over the area in which a depression is planned to be formed;
   reactive ion etching to form said depression having a depth between about 70 to 100 nanometers in the portion of said base region wherein an emitter region is planned to be formed;
   the sides of said depression are substantially vertical without undercutting and the bottom of said depression is substantially planar from one vertical side to another vertical side;
   forming an emitter region in said etched portion of said base region and heating said emitter region wherein a narrow intrinsic base region is formed; and
   making contacts to each of the elements of the said bipolar transistor.

2. The method of claim 1 wherein the said base region has a dopant concentration of between about $1 \times 10^{19}$ to $1 \times 10^{20}$ boron ions/cc.

3. The method of claim 1 wherein the depth of said depression is precisely monitored using a separate test wafer that has its polycrystalline silicon surface simultaneously etched while using a laser light interferometer and the said etching is ended at the designated depth.

4. The method of claim 1 wherein the said reactive ion etching is accomplished using a mask composed layers of silicon dioxide and silicon nitride covering areas not desired to be etched.

5. The method of claim 4 wherein the said reactive ion etching ambient is argon and chlorine gas with a pressure less than about 30 millitorr.

6. The method of claim 3 wherein said test wafer is composed of a silicon dioxide wafer having a polycrystalline silicon layer thereon and said laser is a helium-neon laser.

7. The method of claim 1 wherein said base doping is boron and said emitter doping is arsenic.

8. The method of claim 1 wherein said base width is between about 100 to 400 nanometers.

9. The method of claim 8 wherein the collector base junction depth is between about 500 to 900 nanometers.

10. The method of claim 1 wherein said emitter-base junction depth is between about 200 nanometers to 500 nanometers.

11. The method of claim 1 wherein said bipolar transistor is connected with other transistors in said integrated circuit to form a current switch emitter follower circuit.

12. The method of claim 1 wherein said bipolar transistor is connected with other transistors in said integrated circuit to form a transistor-transistor logic circuit.

* * * * *